(12) United States Patent
Luo

(10) Patent No.: US 12,389,788 B2
(45) Date of Patent: Aug. 12, 2025

(54) DISPLAY SUBSTRATE AND DISPLAY DEVICE

(71) Applicant: BOE Technology Group Co., Ltd., Beijing (CN)

(72) Inventor: Chengyuan Luo, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 155 days.

(21) Appl. No.: 18/465,950

(22) Filed: Sep. 12, 2023

(65) Prior Publication Data

US 2023/0422546 A1 Dec. 28, 2023

Related U.S. Application Data

(62) Division of application No. 16/924,232, filed on Jul. 9, 2020, now Pat. No. 11,839,101.

(30) Foreign Application Priority Data

Aug. 29, 2019 (CN) .......................... 201910810440.6

(51) Int. Cl.
*H10K 50/844* (2023.01)
*H10K 71/00* (2023.01)
*H10K 102/00* (2023.01)

(52) U.S. Cl.
CPC ........... *H10K 50/844* (2023.02); *H10K 71/00* (2023.02); *H10K 2102/00* (2023.02); *H10K 2102/311* (2023.02)

(58) Field of Classification Search
CPC .................... H10K 71/80; H10K 50/84265
See application file for complete search history.

(56) References Cited

U.S. PATENT DOCUMENTS

| | | | |
|---|---|---|---|
| 2014/0332759 A1* | 11/2014 | Meinhold | ........ H10K 59/80517 257/431 |
| 2017/0005293 A1 | 1/2017 | Kim et al. | |
| 2017/0033312 A1 | 2/2017 | Kim et al. | |
| 2017/0278920 A1 | 9/2017 | Park et al. | |

(Continued)

FOREIGN PATENT DOCUMENTS

| | | |
|---|---|---|
| CN | 107275506 A | 10/2017 |
| CN | 108649133 A | 10/2018 |

(Continued)

OTHER PUBLICATIONS

First Office Action dated May 25, 2021 for CN Patent Application No. 201910810440.6 and English Translation.
Non-Final Office Action dated Dec. 3, 2021 for U.S. Appl. No. 16/924,232.

(Continued)

*Primary Examiner* — Yu-Hsi D Sun
(74) *Attorney, Agent, or Firm* — Ling Wu; Stephen Yang; Ling and Yang Intellectual Property

(57) ABSTRACT

A display substrate includes a display region and hollowed-out grooves provided at a periphery of the display region. The display substrate includes a first organic base layer, a light-emitting unit provided on the base structure layer and located at the display region; the first organic base layer is provided with a groove structure located between the hollowed-out grooves and the display region. The display substrate further includes a first inorganic package layer for covering the light-emitting unit and the groove structure.

20 Claims, 4 Drawing Sheets

(56) References Cited

U.S. PATENT DOCUMENTS

| | | |
|---|---|---|
| 2017/0287995 A1 | 10/2017 | Kim et al. |
| 2018/0046221 A1 | 2/2018 | Choi et al. |
| 2018/0090698 A1 | 3/2018 | Jeong et al. |
| 2018/0342700 A1 | 11/2018 | Cai et al. |
| 2019/0207157 A1 | 7/2019 | Gong et al. |
| 2019/0229289 A1 | 7/2019 | Kim et al. |
| 2019/0305235 A1 | 10/2019 | Hsieh et al. |
| 2019/0363266 A1 | 11/2019 | Tanaka |
| 2020/0006704 A1 | 1/2020 | Zhang et al. |
| 2020/0067016 A1 | 2/2020 | Park et al. |
| 2020/0161276 A1 | 5/2020 | Kim et al. |
| 2020/0168824 A1 | 5/2020 | Park et al. |
| 2020/0212117 A1 | 7/2020 | Jeon et al. |
| 2021/0057658 A1 | 2/2021 | Chen |
| 2021/0265317 A1* | 8/2021 | Leirer .................. H01L 33/005 |

FOREIGN PATENT DOCUMENTS

| | | |
|---|---|---|
| CN | 108666352 A | 10/2018 |
| CN | 109449306 A | 3/2019 |
| CN | 109659444 A | 4/2019 |
| CN | 110120463 A | 8/2019 |

OTHER PUBLICATIONS

Final Office Action dated Apr. 7, 2022 for U.S. Appl. No. 16/924,232.
RCE Non-Final Office Action dated Nov. 16, 2022 for U.S. Appl. No. 16/924,232.
RCE Final Office Action dated Mar. 20, 2023 for U.S. Appl. No. 16/924,232.
Advisory Action dated Jun. 22, 2023 for U.S. Appl. No. 16/924,232.
Notice of Allowance dated Jul. 31, 2023 U.S. Appl. No. 16/924,232.

* cited by examiner

DISPLAY SUBSTRATE AND DISPLAY DEVICE

CROSS-REFERENCE TO RELATED APPLICATION(S)

This application is a divisional application of U.S. application Ser. No. 16/924,232 filed on Jul. 9, 2020, which claims the priority of Chinese Patent Application No. 201910810440.6 filed to the CNIPA on Aug. 29, 2019, which are hereby incorporated herein by reference in their entireties.

TECHNICAL FIELD

The present disclosure relates to, but is not limited to, the field of display technology, and particularly relates to a display substrate and a display device.

BACKGROUND

Organic Light-Emitting Diode (OLED) display is a display and lighting technology developed in recent years, which has the advantages of high response, high contrast and flexibility etc., and is considered to have a wide application prospect. In the flexible display, the deformable and bendable characteristics of OLED display devices further reflect the advantage of the OLED display.

As one of the important development directions of flexible display products, stretchable display devices have gained a wide attention because they can be applied to wearable equipment and even clothing. In the stretchable OLED product, the OLED display panel includes multiple display regions arranged in an array, each display region is provided with multiple OLED light-emitting units, and a hollowed-out groove is formed between adjacent display regions, so that when the display panel is stretched, the hollowed-out groove is deformed to prevent the stretching from affecting the display of the display regions.

In stretchable OLED display products, water and oxygen easily invade into OLED light-emitting units, affecting the service life of the display panel.

SUMMARY

The following is a summary of the subject matter described in detail herein. This summary is not intended to limit the protection scope of the claims.

In an aspect, an embodiment of the present disclosure provides a display substrate, which includes a display region and hollowed-out grooves provided on a periphery of the display region, the display substrate includes a base structure layer and a light-emitting unit provided on the base structure layer and located in the display region, the base structure layer includes a first organic base layer, the light-emitting unit is provided on the first organic base layer, the first organic base layer is provided with a groove structure located between the hollowed-out grooves and the display region, and the display substrate further includes a first inorganic encapsulation layer covering the light-emitting unit and the groove structure.

In some possible implementations, the base structure layer further includes a barrier layer and a second organic base layer, the barrier layer is disposed on a side of the first organic base layer facing away from the light-emitting unit, and the second organic base layer is disposed on a side of the barrier layer facing away from the first organic base layer.

In some possible implementations, the thickness of the base structure layer is 10 µm to 50 µm, the thickness of the second organic base layer is 8 µm to 12 µm, the thickness of the barrier layer is 0.05 µm to 2.5 µm, and the thickness of the first organic base layer is 8 µm to 12 µm.

In some possible implementations, the groove structure includes a first groove exposing the barrier layer, and the first inorganic encapsulation layer is in direct contact with the barrier layer at the first groove.

In some possible implementations, the groove structure further includes a second groove located between the first groove and the display region, and the depth of the second groove is smaller than the thickness of the first organic base layer.

In some possible implementations, the groove structure includes multiple second grooves, the multiple second grooves are sequentially provided between the first grooves and the display region, and the depths of the multiple second grooves are sequentially reduced in a direction from the first grooves toward the display region.

In some possible implementations, the longitudinal section shapes of the first groove and the second groove are both in an open shape with gradually increasing openings, and the longitudinal section is a section perpendicular to the length direction of the first groove or the second groove.

In some possible implementations, the depth of the second groove is ¼ to ½ of the thickness of the base structure layer.

In some possible implementations, the spacing between adjacent second grooves is greater than 20 µm, the spacing between the first groove and the second groove adjacent to the first groove is greater than 20 µm, and the spacing between the first groove and the hollowed-out groove is greater than 20 µm.

In some possible implementations, the display substrate further includes an organic encapsulation layer disposed on the first inorganic encapsulation layer and a second inorganic encapsulation layer covering the organic encapsulation layer, the second inorganic encapsulation layer covers the first inorganic encapsulation layer at the position of the groove structure.

In some possible implementations, the size of the hollowed-out groove is larger than the size of the display region in a direction along the length of the hollow groove, and both ends of the hollowed-out groove protrude beyond the boundary of the display region.

In some possible implementations, the size of the groove structure is larger than the size of the display region in a direction along the length of the groove structure, and both ends of the groove structure protrude beyond the boundary of the display region.

In some possible implementations, the size of the first groove and the second groove are both larger than the size of the display region along the length direction of the groove structure, and both ends of the first groove and the second groove protrude beyond the boundary of the display region.

In another aspect, an embodiment of the present application further provides a method for preparing a display substrate, including: forming a first organic base layer on a hard carrier plate, the first organic base layer having a hollowed-out groove exposing the hard carrier plate and a groove structure located between the hollowed-out groove and a display region; forming a light-emitting unit in the display region on the first organic base layer, the first organic base layer being exposed in an region other than the display region; depositing a first inorganic encapsulation film on the hard carrier plate on which the light-emitting unit is formed, the first inorganic encapsulation film covering the groove structure; and stripping the hard carrier plate to form the display substrate.

In some possible implementations, forming a first organic base layer on a hard carrier plate includes: coating a flexible material on the hard carrier plate, curing the flexible material into a film to form a second organic base film; depositing a barrier film on the second organic base film, removing the barrier film at the position of the hollowed-out groove through a patterning process to form a barrier layer; coating a flexible material on the hard carrier plate on which the barrier layer is formed, and curing the flexible material into a film to form a first organic base film; patterning the first organic base film and the second organic base film by a photolithography process to form a hollowed-out groove exposing the hard carrier plate, and forming a groove structure between the hollowed-out groove and a display region on the first organic base film.

In yet another aspect, an embodiment of the present disclosure also provides a display device, which includes a display substrate, the display substrate includes a display region and hollowed-out grooves provided on a periphery of the display region; the display substrate includes a base structure layer and a light-emitting unit provided on the base structure layer and located in the display region; the base structure layer includes a first organic base layer; the light-emitting unit is provided on the first organic base layer; the first organic base layer is provided with a groove structure located between the hollowed-out groove and the display region, and the display substrate further includes a first inorganic encapsulation layer covering the light-emitting unit and the groove structure.

In some possible implementations, the base structure layer further includes a barrier layer disposed on a side of the first organic base layer facing away from the light-emitting unit and a second organic base layer disposed on a side of the barrier layer facing away from the first organic base layer.

In some possible implementations, the groove structure includes a first groove exposing the barrier layer, and the first inorganic encapsulation layer is in direct contact with the barrier layer at the first groove.

Other features and advantages of the technical solutions of the present disclosure will be set forth in the description which follows, and in part will become apparent from the description, or be learned by practice of the technical solutions of the present disclosure. Purposes and other advantages of the technical solutions of the present disclosure may be realized and obtained by structures specifically pointed out in the specification, claims and drawings.

BRIEF DESCRIPTION OF THE DRAWINGS

Accompanying drawings are used to provide a further understanding of technical solutions of the present disclosure, form a part of the specification, and explain technical solutions of the present disclosure together with embodiments of the present disclosure, while they do not constitute a limitation on the technical solutions of the present disclosure.

DETAILED DESCRIPTION

In order to make the objects, technical solutions and advantages of the present disclosure clearer, embodiments of the present disclosure will be described in detail below with reference to the accompanying drawings. Those skilled in the art should understand that embodiments and features in the embodiments in the present disclosure may be combined with each other arbitrarily if there is no conflict.

In a stretchable OLED product, an OLED display panel includes multiple display regions arranged in an array, each display region is provided with multiple OLED light-emitting units, and a hollowed-out groove is formed between adjacent display regions, so that when the display panel is stretched, the hollowed-out grooves are deformed to prevent the stretching from affecting the display of the display regions.

The flexible substrate of the stretchable OLED display panel includes an organic base layer on which OLED light-emitting units are provided. In order to improve the stretchability of the stretchable display panel, the stretchable display panel is provided with hollowed-out grooves around the display region. The organic base layer is made of a material with poor water resistance, and a part of the side surface of the organic base layer is exposed through the hollowed-out groove, so that water and oxygen easily invade into the organic base layer from the hollowed-out groove and further invade into the OLED light-emitting units, thus affecting the service life of the display panel.

Figure 1:
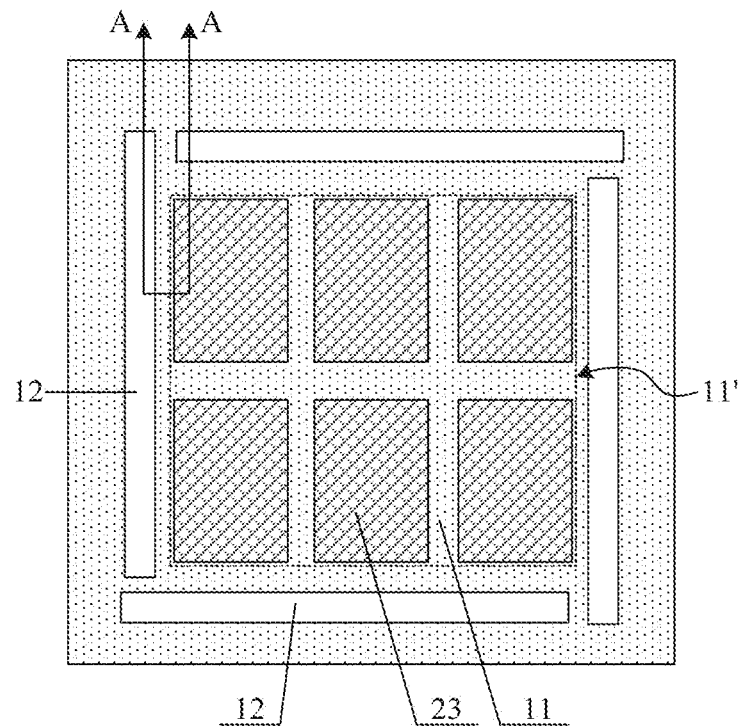
FIG. 1 is a schematic top view of a structure of a stretchable display substrate.
Figure 2:
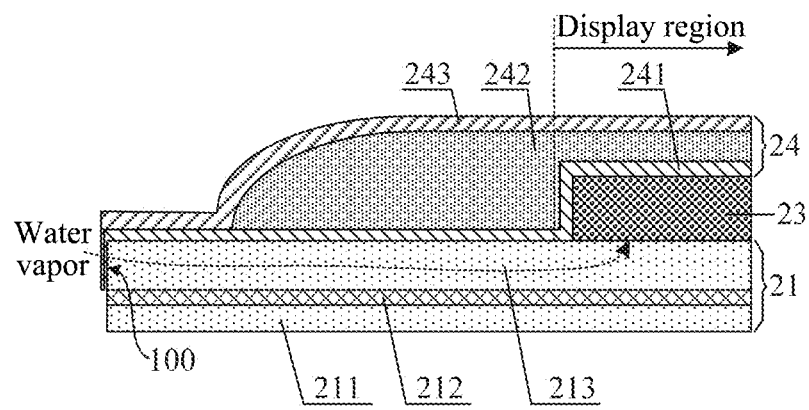
FIG. 2 is a schematic structural diagram of A-A section in FIG. 1.

FIG. 1 is a schematic top view a structure of a stretchable display substrate, and FIG. 2 is a schematic structural view of A-A section in FIG. 1. As shown in FIGS. 1 and 2, the stretchable display substrate includes multiple display regions 11 (a region surrounded by a dotted line frame 11') arranged in an array, multiple light-emitting units 23 are provided in the display region 11, the light-emitting units 23 are usually OLED light-emitting units. A hollowed-out groove 12 is provided between adjacent display regions 11.

As shown in FIG. 2, the stretchable display substrate includes a base structure layer 21, a driving structure layer (not shown in the Figure), a light-emitting unit 23, and an encapsulation structure layer 24. The driving structure layer is located on a side surface of the base structure layer 21, the light-emitting unit 23 is located on the side of the driving structure layer facing away from the base structure layer 21 and is electrically connected with the thin film transistor in the driving structure layer, and both the driving structure layer and the light-emitting unit 23 are located in the display region 11. The encapsulation structure layer 24 is disposed on the base structure layer 21 on which the light-emitting unit 23 is formed, and the encapsulation structure layer 24 covers the display region 11. As shown in FIG. 2, the base structure layer 21 may include a second organic base layer 211, a barrier layer 212 and a first organic base layer 213 from bottom to top. The encapsulation structure layer 24 may include a first inorganic encapsulation layer 241, an organic encapsulation layer 242, and a second inorganic encapsulation layer 243 from bottom to top. The orthographic projections of the first inorganic encapsulation layer 241 and the second inorganic encapsulation layer 243 on the base structure layer 21 coincide, and the orthographic projection of the organic encapsulation layer 242 on the base structure layer 21 is within the range of the orthographic projection of the second inorganic encapsulation layer 243 on the base structure layer 21.

In the stretchable display substrate shown in FIGS. 1 and 2, the first organic base layer 213 has an exposed end face 100 exposed through the hollowed-out groove 12 due to the existence of the hollowed-out groove 12. The material (e.g., polyimide, etc.) of the first organic base layer 213 has poor water resistance. Although a small amount of inorganic material is deposited on the exposed end face 100 to form a protective film when forming the first inorganic encapsulation layer 241 and the second inorganic encapsulation layer 243, the protective film is very thin and cannot block water and oxygen very well, water and oxygen may still invade the first organic base layer 213 from the exposed end face 100 and further invade the light-emitting unit 23, affecting the service life of the stretchable display substrate.

In order to solve the above technical problems, an embodiment of the present disclosure provides a display substrate. The display substrate includes a display region and hollowed-out grooves provided on the periphery of the display region. The display substrate includes a base structure layer, a light-emitting unit provided on the base structure layer and located in the display region, the base structure layer includes a first organic base layer, the light-emitting unit is provided on the first organic base layer, the first organic base layer is provided with a groove structure located between the hollowed-out grooves and the display region, and the display substrate further includes a first inorganic encapsulation layer covering the light-emitting unit and the groove structure.

Figure 3:
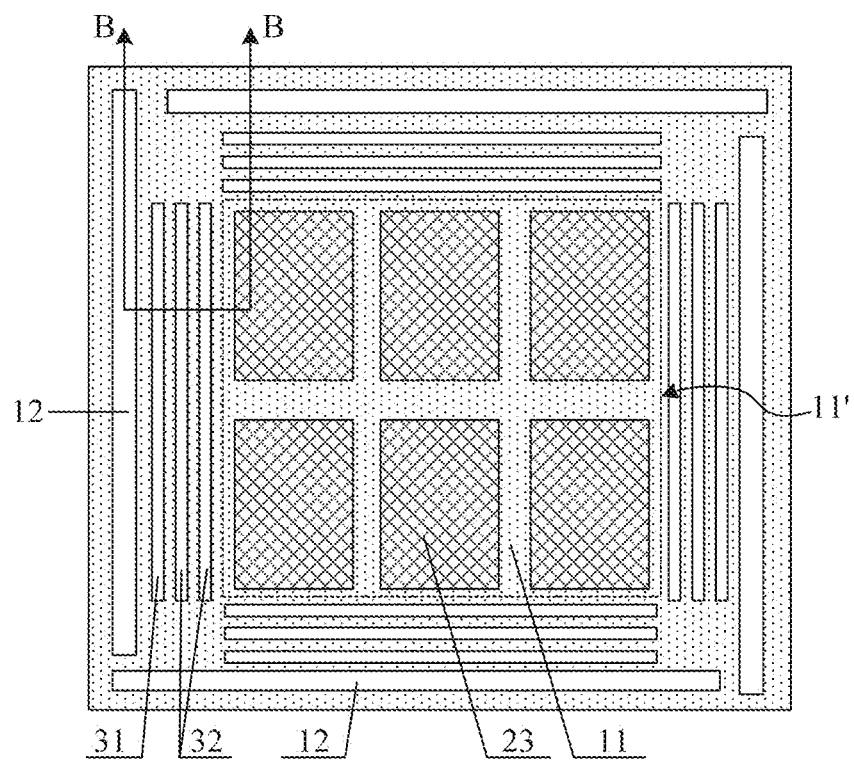
FIG. 3 is a schematic top view of a structure of a display substrate according to an exemplary embodiment of the present disclosure.
Figure 4:
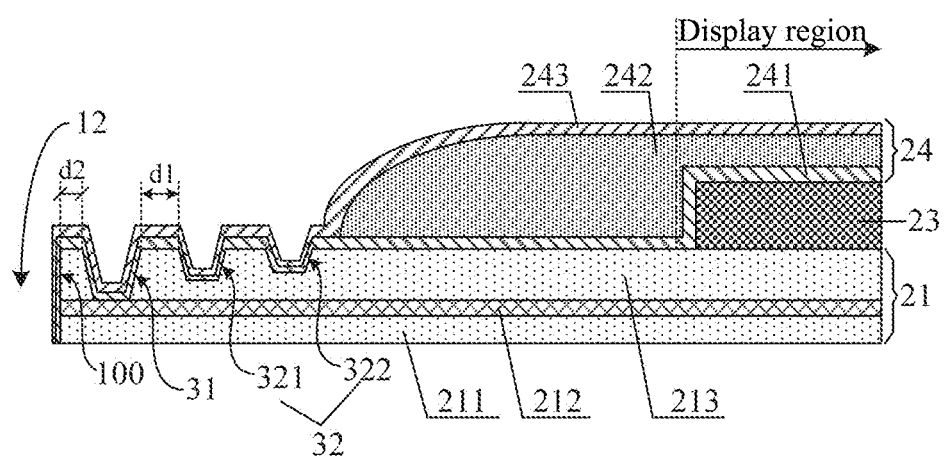
FIG. 4 is a schematic structural diagram of B-B section in FIG. 3.

FIG. 3 is a schematic top view of a structure of a display substrate in an exemplary embodiment of the present disclosure, and FIG. 4 is a schematic structural diagram of a section B-B in FIG. 3. As shown in FIG. 3, the display substrate includes a display region 11 (a region surrounded by a dotted line frame 11'), the periphery of the display region 11 is provided with hollowed-out grooves 12, at least one light-emitting unit 23 is provided in the display region 11, and the light-emitting unit 23 may include an OLED light-emitting unit. As shown in FIG. 4, the display substrate includes a base structure layer 21, which may include a first organic base layer 213. The first organic base layer 213 is provided with a groove structure, and the groove structure is located between the hollowed-out groove 12 and the display region 11. The display substrate further includes a driving structure layer (not shown in the Figure) disposed on the first organic base layer 213. The driving structure layer is located in the display region 11 and includes a thin film transistor. The light-emitting unit 23 is provided on the driving structure layer and located in the display region 11, and the light-emitting unit 23 is electrically connected with a corresponding thin film transistor of the driving structure layer. The display substrate further includes an encapsulation structure layer 24 covering the light-emitting unit 23. The encapsulation structure layer 24 covers the display region 11, and the encapsulation structure layer 24 includes a first inorganic encapsulation layer 241 covering the light-emitting unit 23 and the exposed surface of the groove structure.

Those skilled in the art can understand that, as shown in FIG. 4, the first organic base layer 213 has an exposed end face 100 exposed through a hollow groove. Although a small amount of inorganic material covers the exposed end face 100 when forming the first inorganic encapsulation layer 241, the inorganic material covering the exposed end face 100 is very thin and cannot block water and oxygen very well. In the display substrate of an embodiment of the present disclosure, a groove structure located between the hollowed-out groove 12 and the display region 11 is formed on the first organic base layer 213, and the first inorganic encapsulation layer 241 covers the exposed surface of the groove structure. Thus when water and oxygen invade from the exposed end face 100 of the first organic base layer 213, the provision of the first inorganic encapsulation layer 241 makes the cross section of the first organic base layer 213 in the direction perpendicular to the water and oxygen intrusion path (i.e., in the direction perpendicular to the horizontal direction) become smaller at the position of the groove structure, i.e., the provision of the first inorganic encapsulation layer 241 makes the cross section of the first organic base layer 213 in the vertical direction become smaller at the position of the groove structure, thereby blocking a part of the water and oxygen from invading into the first organic base layer 213 close to the display region, and further blocking the water and oxygen from invading into the light-emitting unit 23, reducing the influence on the service life of the display substrate, and prolonging the service life of the display substrate.

In an exemplary embodiment, as shown in FIG. 4, the base structure layer 21 may further include a barrier layer 212 disposed on a side of the first organic base layer 213 facing away from the light-emitting unit and a second organic base layer 211 disposed on a side of the barrier layer 212 facing away from the first organic base layer 213. Such base structure layer has good flexibility and rigidity, and is favorable for stripping the display substrate from the hard carrier plate during the subsequent stripping from the hard carrier plate.

Those skilled in the art can understand that each light-emitting unit 23 may include sub-pixel units of at least three colors, e.g., R, G, B. Each sub-pixel unit is electrically connected with a corresponding thin film transistor in the driving structure layer respectively, so that each sub-pixel unit can realize independent switch control and display.

In an exemplary embodiment, as shown in FIG. 4, the groove structure may include a first groove 31 through which the barrier layer 212 is exposed. In the first groove 31 of this structure, when the first inorganic encapsulation layer 241 covers the exposed surface of the groove structure, the first inorganic encapsulation layer 241 covers the exposed surface of the first groove 31, that is, the first inorganic encapsulation layer 241 is in directly contact with the barrier layer 212 at the first groove 31, so that the first inorganic encapsulation layer 241 completely blocks the first organic base layer located at both sides of the first groove 31, preventing water and oxygen from invading into the first organic base layer close to the display region through the exposed end face 100, thus preventing water and oxygen from invading into the light-emitting unit 23, and ensuring the service life of the display substrate.

In an exemplary embodiment, as shown in FIG. 4, the groove structure may further include a second groove 32 located between the first groove 31 and the display region 11, and the depth of the second groove 32 is smaller than the depth of the first groove 31. When the first inorganic encapsulation layer 241 covers the exposed surface of the groove structure, the first inorganic encapsulation layer 241 covers the exposed surface of the second groove 32. The depth of the second groove 32 is ¼ to ½ of the thickness of the base structure layer 21.

In an exemplary embodiment, the number of second grooves 32 may be one or more. When there are multiple second grooves 32, the multiple second grooves may be sequentially provided in a region between the first groove 31 and the display region 11, and the depths of the multiple second grooves may be sequentially decreased in the direction from the first groove 31 toward the display region 11. For example, as shown in FIG. 4, the number of second grooves 32 is 2. In the direction from the first groove 31 toward the display region 11, the depth of the second groove 322 is smaller than the depth of the second groove 321. In an exemplary embodiment, the depth of the second groove 321 is 8 μm, and the depth of the second groove 322 is 6 μm. Those skilled in the art can understand that the depth of the groove is the size of the groove in a direction perpendicular to the display substrate.

During the stretching of the display substrate, the second groove 32 may be provided to serve as a stretching buffer region, so as to reduce the damage of the stretching stress to the first inorganic encapsulation layer 241. In addition, the first inorganic encapsulation layer 241 covering the exposed surface of the second groove 32 may further block the lateral water and oxygen to prevent the water and oxygen from entering the first organic base layer 213 through the side surface of the second groove.

In an exemplary embodiment, as shown in FIG. 4, the spacing between adjacent second grooves is greater than 20 μm, and the spacing d1 between the first groove and the second groove adjacent thereto is also greater than 20 μm. The spacing d2 between the first groove 31 and the hollowed-out groove 12 is larger than 20 μm. Setting the spacing to be greater than 20 μm is beneficial to forming complete first groove and second groove, thus improving the product yield.

In order to ensure that the first inorganic encapsulation layer 241 covers the surface of the groove structure, as shown in FIG. 4, in the direction from the barrier layer 212 toward the first organic base layer 213, the longitudinal section shapes of the first groove and the second groove are both open shapes with the opening gradually increasing, here, the longitudinal section is a section perpendicular to the length direction of the first groove or the second groove. Therefore, when the first inorganic encapsulation layer 241 is formed, the first inorganic encapsulation layer 241 may be uniformly deposited and distributed on the exposed surfaces of the first groove and the second groove, thereby preventing a rift on the first inorganic encapsulation layer 241 on the side surface of the groove and preventing water and oxygen from entering the first organic base layer 213 from the groove.

In an exemplary embodiment, the cross section of the groove may be inverted trapezoidal, as shown in FIG. 4. The cross sections of the first groove 31 and the second groove 32 are both inverted trapezoidal.

In an exemplary embodiment, the base structure layer 21 includes a second organic base layer 211, a barrier layer 212 disposed on the second organic base layer 211, and a first organic base layer 213 disposed on the barrier layer 212. The entire thickness of the base structure layer 21 may be 10 μm to 50 μm. The thickness of the second organic base layer 211 may be 8 μm to 12 μm, for example, the thickness of the second organic base layer 211 may be one of 8 μm, 9 μm, 10 μm, 11 μm and 12 μm; the thickness of the barrier layer 212 may be 0.05 μm to 2.5 μm, for example, the thickness of the barrier layer 212 may be one of 0.05 μm, 0.1 μm, 1.0 μm, 1.5 μm, 2.0 μm, 2.5 μm; the thickness of the first organic base layer 213 may be 8 μm to 12 μm, for example, the thickness of the first organic base layer 213 may be one of 8 μm, 9 μm, 10 μm, 11 μm, 12 μm. The materials of the second organic base layer 211 and the first organic base layer 213 may be the same, for example, each may include at least one of the following materials: polyimide PI, polyethylene terephthalate PET, and a surface-treated polymer soft film, etc. The material of the barrier layer 212 may include a material having a function of blocking water and oxygen. For example, the material of the barrier layer 212 may include at least one of silicon nitride, silicon oxide, silicon carbide (SiC), aluminum oxide (Al2O3), ZnS, ZnO, and the like.

In an exemplary embodiment, the encapsulation structure layer 24 may further include an organic encapsulation layer 242 and a second inorganic encapsulation layer 243. The organic encapsulation layer 242 is disposed on the first inorganic encapsulation layer 241, the thickness of the organic encapsulation layer 242 may be 10 μm to 20 μm, and the second inorganic encapsulation layer 243 is disposed on the organic encapsulation layer 242. The orthographic projection of the organic encapsulation layer 242 on the base structure layer 21 is within the range of the orthographic projection of the first inorganic encapsulation layer 241 on the base structure layer 21. The second inorganic encapsulation layer 243 covers the display region 11, and the second inorganic encapsulation layer 243 covers the surface of the groove structure, that is, the second inorganic encapsulation layer 243 covers the surface of the first inorganic encapsulation layer 241 located at the position of the groove structure. In such a structure, two inorganic material layers are disposed at the groove structure, thus enhancing the blocking effect on water and oxygen.

In another embodiment, the encapsulation structure layer may include more inorganic encapsulation layers and organic encapsulation layers, the encapsulation structure layer is a structure in which inorganic encapsulation layers and organic encapsulation layers are alternately stacked, a layer of the encapsulation structure layer close to the light-emitting unit is an inorganic encapsulation layer, and a layer away from the light-emitting unit is also an inorganic encapsulation layer.

In an exemplary embodiment, as shown in FIG. 3, in the length direction of the hollowed-out groove 12 (i.e., the extending direction of the hollowed-out groove), the size of the hollowed-out groove 12 is larger than the size of the display region 11, and both ends of the hollowed-out groove 12 protrude beyond the boundary of the display region 11. In the process of stretching the display substrate, such hollowed-out groove is deformed, the display region is prevented from being stretched, the display region is well protected, and the performance of the display substrate is ensured.

In an exemplary embodiment, as shown in FIG. 3, in the length direction of the groove structure (i.e., the extending direction of the groove structure), the size of the groove structure is larger than the size of the display region, and both ends of the groove structure protrude beyond the boundary of the display region 11. In an exemplary embodiment, as shown in FIG. 3, in the extending direction of the groove structure, the size of the first groove 31 is larger than the size of the display region, and both ends of the first groove 31 protrude beyond the boundary of the display region. The size of the second groove 32 is larger than the size of the display region, and both ends of the second groove 31 protrude beyond the boundary of the display region. With such a structure, water and oxygen can be completely blocked from entering the display region along the horizontal direction, and the water and oxygen resistance of the display substrate is better enhanced.

An embodiment of the present disclosure also provides a method for preparing the display substrate shown in FIG. 4, which may include: forming a first organic base layer on a hard carrier plate, the first organic base layer having a hollowed-out groove exposing the hard carrier plate and a groove structure located between the hollowed-out groove and a display region; forming a light-emitting unit in a display region on the first organic base layer, the first organic base layer being exposed in an region other than the display region; depositing a first inorganic encapsulation film on the hard carrier plate on which the light-emitting unit is formed, the first inorganic encapsulation film covering the groove structure; and stripping the hard carrier plate to form the display substrate.

The technical solutions of embodiments of the present disclosure are described below in detail through the preparation process of the display substrate. Among them, the "patterning process" in the present disclosure includes processes such as depositing a film layer, coating photoresist, mask exposure, development, etching, stripping photoresist, the "photolithography process" in the present disclosure includes processes such as mask exposure, development, and evaporation, deposition, coating, applying, etc. in the present disclosure are mature preparation processes in related technologies.

In an exemplary embodiment, the preparing process of the display substrate may include the following operations.

Figure 5:
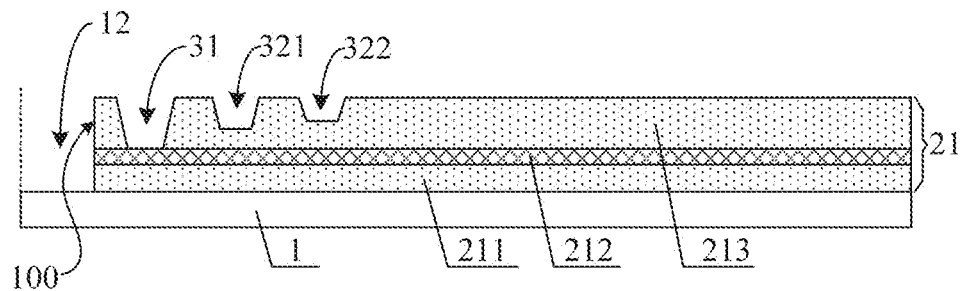
FIG. 5 is a schematic diagram of a structure of a display substrate after a base structure layer is formed.

(1) A first organic base layer is formed on a hard carrier plate, which specifically includes: coating a flexible material on the hard carrier plate 1, curing the flexible material into a film, to form a second organic base film; depositing a barrier film on a second organic base film, patterning the barrier film through a patterning process, removing the barrier film at the position of the hollowed-out groove 12, to form a barrier layer 212; coating a flexible material on the hard carrier plate 1 on which the barrier layer 212 is formed, curing the flexible material into a film, to form a first organic base film, and patterning the first organic base film and the second organic base film by using a photolithography process to form a first organic base layer 213 and a second organic base layer 211, as shown in FIG. 5, FIG. 5 is a schematic diagram of a structure of a display substrate after a base structure layer is formed. The thickness of the formed second organic base film may be 10 μm, the thickness of the barrier layer may be 0.5 μm, and the thickness of the first organic base film may be 10 μm.

In this photolithography process, the first organic base film and the second organic base film located at the position of the hollowed-out groove 12 are completely removed to form the hollowed-out groove 12, and the first organic base layer has an exposed end face 100 exposed through the hollowed-out groove 12; the first organic base film at the position of the first groove 31 is completely removed to form the first groove 31 through which the barrier layer 212 is exposed; the first organic base film at the position of the second groove 32 is partially removed to form the second groove 32. Since the materials of the second organic base layer 211 and the first organic base layer 213 are both flexible materials, the formed substrate structure layer is a flexible substrate. The flexible materials may include at least one of the following materials: polyimide PI, polyethylene terephthalate PET, and surface-treated polymer soft film, etc. The barrier film may be made of a material having a water and oxygen blocking effect, for example, at least one of silicon nitride, silicon oxide, silicon carbide (SiC), aluminum oxide (Al2O3), ZnS, ZnO and the like.

In order to make the side surface of the hollowed-out groove 12 vertical, in an exemplary embodiment, the hollowed-out groove 12 may be formed by a plasma etching process. For example, a metal mask layer may be formed on the first organic base film, the position of the hollowed-out groove 12 is exposed, the position of the hollowed-out groove 12 is etched by a plasma etching process to form a hollowed-out groove with the side being nearly vertical, and then the metal mask layer is removed. Then the first groove and the second groove are formed by a photolithography process.

Figure 6:
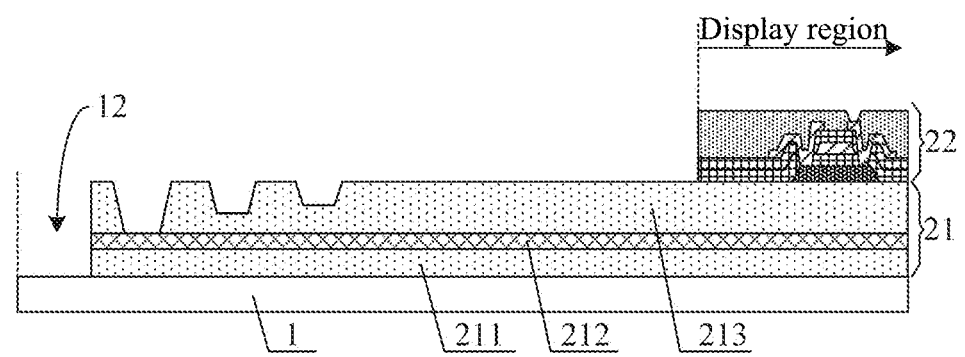
FIG. 6 is a schematic diagram of a structure of a display substrate after a driving structural layer is formed.

(2) A driving structure layer 22 located in the display region is formed on the first organic base layer, as shown in FIG. 6. FIG. 6 is a schematic diagram of the structure of the display substrate after the driving structure layer is formed. In the following, with reference to FIG. 6, the process of forming the driving structure layer will be explained by taking the top gate type thin film transistor as an example. Forming a driving structure layer on the first organic base layer includes: depositing an active thin film on the first organic base layer, and patterning the active thin film through a patterning process to form an active layer located in a display region. In this patterning process, the active thin film at a position other than the position of the active layer is etched away, exposing the first organic base layer 213.

A first insulating film and a gate metal film are sequentially deposited on the hard carrier plate 1 on which the active layer is formed, and the gate metal film is patterned by a patterning process to form a gate electrode and a gate line (not shown in the figure) located in a display region. In this patterning process, the gate metal film at a position other than the position of the gate electrode and the gate line is etched away, exposing the first insulating film.

A second insulating film is deposited on the first insulating film on which the gate electrode is formed, and the second insulating film and the first insulating film are patterned by a patterning process to form a second insulating layer (also referred to as an interlayer insulating layer) and a first insulating layer (also referred to as a gate insulating layer) located in a display region, as shown in FIG. 6. The first insulating layer and the second insulating layer are provided with a first via hole and a second via hole, and the active layer is exposed through the first via hole and the second via hole. In this patterning process, the second insulating film and the first insulating film located in the region other than the display region are etched away, exposing the first organic base layer 213 and the hollowed-out groove 12.

A second metal film is depositing on the hard carrier plate 1 on which the second insulating layer is formed, and the second metal film is patterned by a patterning process to form a source electrode, a drain electrode and a data line (not shown in the figure), the source electrode and the drain electrode are electrically connected with the active layer through the first via hole and the second via hole respectively. In this patterning process, the second metal film at a position other than the position of the source electrode, drain electrode and data line is etched away, exposing the first organic base layer 213 and the hollowed-out groove 12 in the region other than the display region.

A flat layer located in the display region is formed on the hard carrier plate on which the source electrode and the drain electrode are formed, a third via hole for exposing the drain electrode is provided on the flat layer, and the first organic base layer 213 and the hollowed-out groove 12 are exposed in the region other than the display region, as shown in FIG. 6.

Those skilled in the art can understand that the first insulating film and the second insulating film are both made of silicon oxide or/and silicon nitride materials, and the silicon oxide and silicon nitride materials have the function of blocking water and oxygen, so in the process of patterning the first insulating film and the second insulating film, only the first insulating film and the second insulating film at the positions of the first via hole and the second via hole may be removed, and the first insulating film and the second insulating film at other positions may be reserved. At this time, the first insulating film and the second insulating film retained at the positions of the first groove 31 and the second groove 32 can completely block the first organic base layer located at both sides of the first groove 31, preventing water and oxygen from invading into the first organic base layer close to the display region through the exposed end face 100. When the first insulating film and the second insulating film are retained at the first groove and the second groove, the subsequently formed first inorganic encapsulation layer may directly cover the surface of the second insulating film at the positions of the first groove and the second groove.

Figure 7:
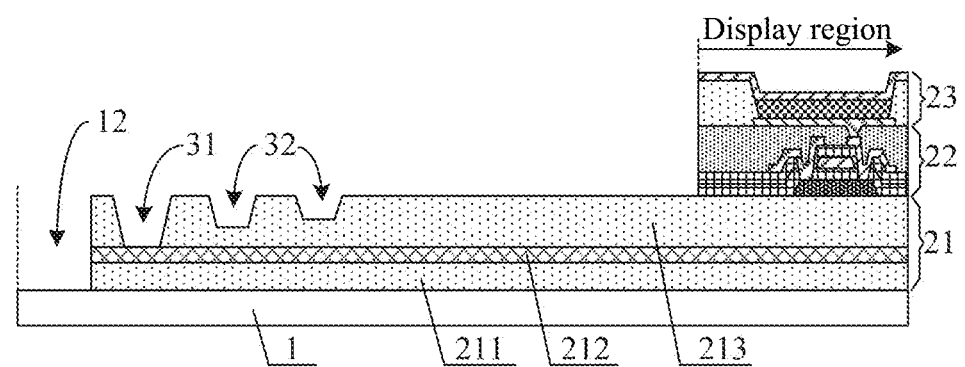
FIG. 7 is a schematic diagram of a structure of a display substrate after a light-emitting unit is formed.

(3) A light-emitting unit 23 located in the display region is formed on the driving structure layer 22. The light-emitting unit 23 may be an OLED light-emitting unit. The first organic base layer 213 and the hollowed-out groove 12 are exposed in the region other than the display region, as shown in FIG. 7, FIG. 7 is a schematic diagram of the structure of the display substrate after the light-emitting unit is formed. Those skilled in the art may understand that the process of forming the light-emitting unit 23 may include the steps of sequentially forming an anode, a pixel defining layer, an organic light-emitting layer and a cathode, and the light-emitting unit 23 may be formed by using conventional processes and methods in the art, which will not be repeated again.

Figure 8:
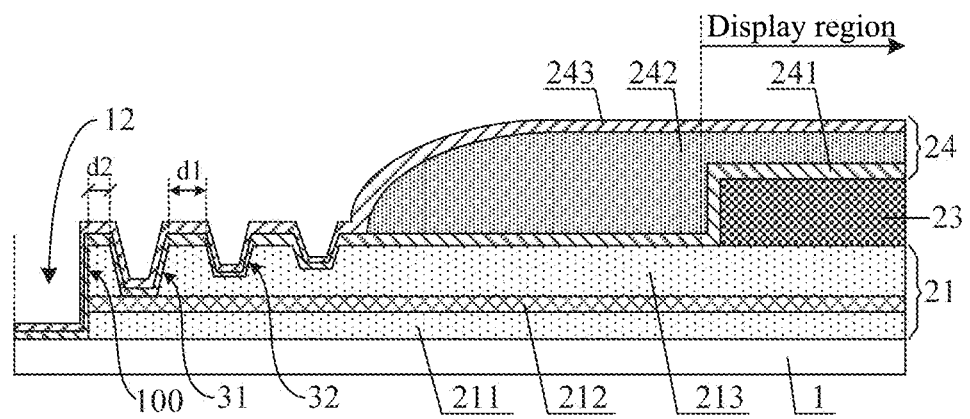
FIG. 8 is a schematic diagram of a structure of a display substrate after a second inorganic encapsulation film is formed.

(4) An encapsulation structure layer 24 is formed on the hard carrier plate 1 on which the light-emitting units 23 are formed, as shown in FIG. 8, FIG. 8 is a schematic diagram of a structure of a display substrate after a second inorganic encapsulation film is formed. This step may include: depositing a first inorganic encapsulation film on the hard carrier plate 1 on which the light-emitting unit 23 is formed, and covering, by the first inorganic encapsulation film, the surfaces of the first groove 31 and the second groove 32.

An organic encapsulation layer 242 is formed on the first inorganic encapsulation film, and the orthographic projection of the organic encapsulation layer 242 on the base structure layer surrounds the orthographic projection of the display region on the base structure layer. The material of the organic encapsulation layer 242 can be a mixture of a Monomer organic main body (more than 95% in volume) and a photoinitiator, a reactive diluent, various additives and the like, and can be formed into a film by ink jet printing and cured under ultraviolet light irradiation to form the organic encapsulation layer 242. The thickness of the organic encapsulation layer 242 can be 10 μm to 20 μm.

A second inorganic encapsulation film is deposited on the first inorganic encapsulation film on which the organic encapsulation layer 242 is formed, and the second inorganic encapsulation film covers the surfaces of the first inorganic encapsulation film at the positions of the first groove 31 and the second groove 32.

The materials of the first inorganic encapsulation film and the second inorganic encapsulation film may include materials having a water and oxygen blocking effect, for example, at least one of silicon nitride, silicon oxide, silicon carbide (SiC), aluminum oxide (Al2O3), ZnS, ZnO and the like. The first inorganic encapsulation film and the second inorganic encapsulation film may be formed by means of chemical vapor deposition (CVD), atomic layer deposition (ALD) and other deposition modes, and the thicknesses of the first inorganic encapsulation film and the second inorganic encapsulation film may be 0.05 μm to 2.5 μm.

(5) Finally, the hard carrier plate 1 is stripped to form the stretchable flexible OLED display substrate according to an embodiment of the present disclosure, as shown in FIG. 4. Wherein, since the first inorganic encapsulation film and the second inorganic encapsulation film at the position of the hollowed-out groove are directly formed on the hard carrier plate 1, when the hard carrier plate 1 is stripped, the first inorganic encapsulation film and the second inorganic encapsulation film are stripped together from the position of the hollowed-out groove, thereby forming the first inorganic encapsulation layer 241 and the second inorganic encapsulation layer 243 as shown in FIG. 4. The second inorganic encapsulation film and the first inorganic encapsulation film covering the exposed end face of the base structure layer are retained. The orthographic projection of the organic encapsulation layer 242 on the base structure layer 21 is within the range of the orthographic projection of the first inorganic encapsulation layer 243 on the base structure layer 21.

Those skilled in the art may understand that the display substrate prepared with the above preparation method is a top-emitting OLED display substrate. The method for preparing a display substrate provided by an embodiment of the disclosure may also be applied to a bottom-emitting OLED display substrate. For the bottom-emitting OLED display substrate, the method of forming each film layer on a first organic base layer is a well-known technology in the art, and the beneficial effects of embodiments of the present disclosure can be achieved as long as the formed first inorganic encapsulation film covers the groove structure.

Figure 9:
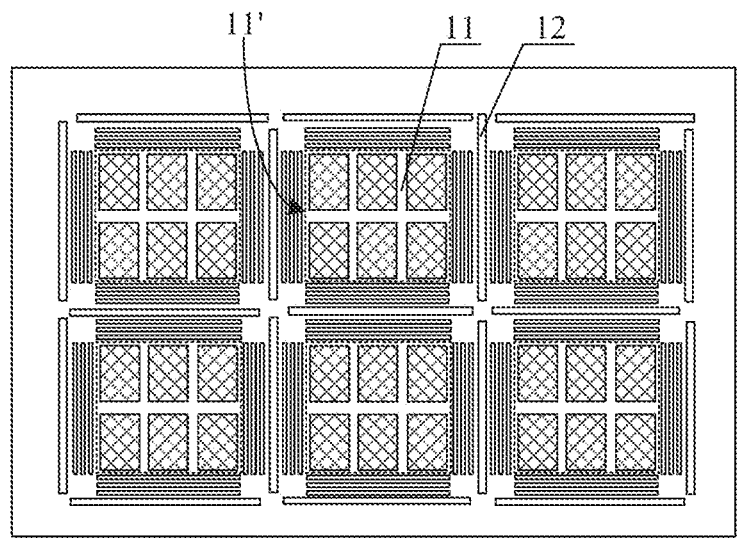
FIG. 9 is a schematic diagram of an overall top view structure of a display substrate according to an exemplary embodiment of the present disclosure.

FIG. 9 is a schematic diagram of an overall top view structure of a display substrate in an exemplary embodiment of the disclosure. As shown in FIG. 9, the display substrate includes multiple display regions 11 arranged in an array, a hollowed-out groove 12 is located between adjacent display regions 11, and the display substrate is a stretchable OLED display substrate.

An embodiment of the disclosure also provides a display device, which includes the display substrate adopting the previous embodiment. The display device may be any product or component with a display function such as a mobile phone, a tablet computer, a television, a display, a notebook computer, a digital photo frame, a navigator.

In the description of the present disclosure, it should be understood that an orientation or position relationship indicated by terms "middle", "upper", "lower", "front", "rear", "vertical", "horizontal", "top", "bottom", "inside", "out-side" or the like is based on the orientation or position relationship shown in the drawings, and this is only for ease of description of the present disclosure and simplification of the description, rather than indicating or implying that the referred apparatus or element must have a specific orientation, or be constructed and operated in a particular orientation, and therefore this cannot be interpreted as a limitation on the present disclosure.

In the description of embodiments of present disclosure, it should be noted that unless otherwise clearly specified and defined, terms "install", "connect" and "link" should be broadly interpreted, for example, it may be fixedly connected, or may be removable connected, or may be integrally connected; it may be mechanically connected, or may be electrically connected; it may be directly connected, or may be indirectly connected through an intermediate medium, or it may be an internal connection of two elements. For those of ordinary skill in the art, the specific meanings of the above terms in the present disclosure may be understood according to a specific situation.

Although the embodiments disclosed in the present disclosure are as the above, the contents are only embodiments for facilitating understanding the present disclosure, rather than for restricting the present disclosure. Any person skilled in the field to which the present disclosure pertains may make any modifications and variations in the forms and details of implementation without departing from the spirit and the scope disclosed by the present disclosure. However, the patent protection scope of the present disclosure shall still be subject to the scope defined by the appended claims.

The invention claimed is:

1. A display substrate, disposed on a hard carrier plate, comprising a plurality of display regions arranged in an array and a plurality of hollowed grooves provided on a periphery of the display regions, wherein:

the hollowed grooves are formed between adjacent display regions respectively, in a case that the display substrate is stretched, the hollowed grooves are deformed;

the display substrate comprises a base structure layer and a light-emitting unit provided on the base structure layer and located in the display regions, the base structure layer comprises a first organic base layer, a second organic base layer and a barrier layer disposed on the second organic base layer, wherein the first organic base layer is disposed on the hard carrier plate, the first organic base layer is provided a hollowed groove of the plurality of hollowed grooves exposing the hard carrier plate, the first organic base layer is disposed on a side of the barrier layer facing away from the second organic base layer, the light-emitting unit being provided on the first organic base layer, the first organic base layer being provided with a groove structure located between the hollowed grooves and the display regions, the display substrate further comprises a first inorganic encapsulation layer covering the light-emitting unit and the groove structure, the first inorganic encapsulation layer is disposed on the hard carrier plate on which the light-emitting unit is formed;

the first inorganic encapsulation layer is in direct contact with the barrier layer at a first groove of the groove structure, the first organic base layer located at both sides of the first groove is completely blocked by the first inorganic encapsulation layer, and in a region other than the display regions, the first organic base layer comprises an exposed surface, the exposed surface is exposed at a location of the hollowed grooves;

the groove structure further comprises a plurality of second grooves, the plurality of second grooves is sequentially provided in a region between the first groove and the display regions, and depth of the plurality of second grooves is sequentially decreased in a direction from the first groove toward the display regions;

in a direction from the barrier layer toward the first organic base layer, shapes of longitudinal sections of the first groove and the second grooves are both open shapes with an opening gradually increasing, wherein the longitudinal sections are sections perpendicular to a length direction of the first groove or the second grooves; and a length of the hollowed grooves is longer than lengths of the first groove and the second grooves.

2. The display substrate according to claim 1, wherein the barrier layer is provided on a side of the first organic base layer facing away from the light-emitting unit, and the second organic base layer is provided on a side of the barrier layer facing away from the first organic base layer.

3. The display substrate according to claim 2, wherein a thickness of the base structure layer is 10 μm to 50 μm, a thickness of the second organic base layer is 8 μm to 12 μm, a thickness of the barrier layer is 0.05 μm to 2.5 μm, and a thickness of the first organic base layer is 8 μm to 12 μm.

4. The display substrate according to claim 2, wherein the first groove exposes the barrier layer, and the first inorganic encapsulation layer is in direct contact with the barrier layer at the first groove.

5. The display substrate according to claim 4, the depth of the second grooves is smaller than a thickness of the first organic base layer.

6. The display substrate according to claim 5, wherein a size of the first groove and a size of the second grooves are both larger than a size of the display regions in a length direction of the groove structure, and both ends of the first groove and the second grooves protrude beyond a boundary of the display regions.

7. The display substrate according to claim 4, wherein the display substrate further comprises an organic encapsulation layer provided on the first inorganic encapsulation layer and a second inorganic encapsulation layer covering the organic encapsulation layer, and the second inorganic encapsulation layer covers the first inorganic encapsulation layer at a position of the groove structure.

8. The display substrate according to claim 4, wherein a size of the groove structure is larger than a size of the display regions in a length direction of the groove structure, and both ends of the groove structure protrude beyond a boundary of the display regions.

9. The display substrate according to claim 2, wherein the thickness of the second organic base film is 10 μm, the thickness of the barrier layer is 0.5 μm, and the thickness of the first organic base film is 10 μm.

10. The display substrate according to claim 1, wherein the depth of the second grooves is ¼ to ½ of the thickness of the base structure layer.

11. The display substrate according to claim 1, wherein a spacing between adjacent second grooves is greater than 20 μm, a spacing between the first groove and a second groove close to the first groove is greater than 20 μm, and a spacing between the first groove and the hollowed groove is greater than 20 μm.

12. The display substrate according to claim 1, wherein the display substrate further comprises an organic encapsulation layer provided on the first inorganic encapsulation layer and a second inorganic encapsulation layer covering the organic encapsulation layer, and the second inorganic encapsulation layer covers the first inorganic encapsulation layer at a position of the groove structure.

13. The display substrate according to claim 12, wherein an orthographic projection of the organic encapsulation layer on the base structure layer is within a range of an orthographic projection of the first inorganic encapsulation layer on the base structure layer.

14. The display substrate according to claim 1, wherein a size of the hollowed grooves is larger than a size of the display regions in a length direction of the hollowed grooves, and both ends of the hollowed grooves protrude beyond a boundary of the display regions.

15. The display substrate according to claim 1, wherein a size of the groove structure is larger than a size of the display regions in a length direction of the groove structure, and both ends of the groove structure protrude beyond a boundary of the display regions.

16. The display substrate according to claim 1, further comprising: a first insulating layer, a second insulating layer and an active layer, wherein the first insulating layer and the second insulating layer are provided with a first via hole and a second via hole respectively, and the active layer is exposed through the first via hole and the second via hole.

17. The display substrate according to claim 16, further comprising: source electrodes and drain electrodes, wherein the source electrodes and drain electrodes are electrically connected with the active layer through the first via hole and the second via hole respectively.

18. A display device, comprising a display substrate, wherein the display substrate is disposed on a hard carrier plate and comprises a plurality of display regions arranged in an array and a plurality of hollowed grooves provided on a periphery of the display regions, wherein:
- the hollowed grooves are formed between adjacent display regions respectively, in a case that the display substrate is stretched, the hollowed grooves are deformed;
- the display substrate comprises a base structure layer and a light-emitting unit provided on the base structure layer and located in the display regions, the base structure layer comprises a first organic base layer, a second organic base layer and a barrier layer disposed on the second organic base layer, wherein the first organic base layer is disposed on the hard carrier plate, the first organic base layer is provided a hollowed groove of the plurality of hollowed grooves exposing the hard carrier plate, the first organic base layer is disposed on a side of the barrier layer facing away from the second organic base layer, the light-emitting unit being provided on the first organic base layer, the first organic base layer being provided with a groove structure located between the hollowed grooves and the display regions, and the display substrate further comprises a first inorganic encapsulation layer covering the light-emitting unit and the groove structure, the first inorganic encapsulation layer is disposed on the hard carrier plate on which the light-emitting unit is formed;
- the first inorganic encapsulation layer is in direct contact with the barrier layer at a first groove of the groove structure, the first organic base layer located at both sides of the first groove is completely blocked by the first inorganic encapsulation layer, and in a region other than the display regions, the first organic base layer comprises an exposed surface, the exposed surface is exposed at a location of the hollowed grooves;
- the groove structure further comprises a plurality of second grooves, the plurality of second grooves is sequentially provided in a region between the first groove and the display regions, and depth of the plurality of second grooves is sequentially decreased in a direction from the first groove toward the display regions;
- in a direction from the barrier layer toward the first organic base layer, shapes of longitudinal sections of the first groove and the second grooves are both open shapes with an opening gradually increasing, wherein the longitudinal sections are sections perpendicular to a length direction of the first groove or the second grooves; and
- a length of the hollowed grooves is longer than lengths of the first groove and the second grooves.

19. The display device according to claim 18, wherein the barrier layer is provided on a side of the first organic base layer facing away from the light-emitting unit, and the second organic base layer is provided on a side of the barrier layer facing away from the first organic base layer.

20. The display device according to claim 19, wherein the first groove exposes the barrier layer, and the first inorganic encapsulation layer is in direct contact with the barrier layer at the first groove.

* * * * *